(12) United States Patent
Morii et al.

(10) Patent No.: US 7,449,252 B2
(45) Date of Patent: Nov. 11, 2008

(54) ORGANIC ELECTROLUMINESCENT DEVICE, MANUFACTURING METHOD THEREOF, AND ELECTRONIC APPARATUS

(75) Inventors: Katsuyuki Morii, Lausanne (CH); Hirofumi Sakai, Suwa (JP); Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 263 days.

(21) Appl. No.: 11/187,955

(22) Filed: Jul. 25, 2005

(65) Prior Publication Data
US 2006/0040134 A1 Feb. 23, 2006

(30) Foreign Application Priority Data
Aug. 20, 2004 (JP) .............................. 2004-240449

(51) Int. Cl.
*H01L 51/50* (2006.01)
*B05D 5/12* (2006.01)

(52) U.S. Cl. .................. 428/690; 427/66; 428/917; 313/504; 313/506

(58) Field of Classification Search ............... 428/690, 428/917, 328; 313/504, 506, 503; 427/66
See application file for complete search history.

(56) References Cited

U.S. PATENT DOCUMENTS

| | | | |
|---|---|---|---|
| 6,573,650 B2 | 6/2003 | Aoki et al. | |
| 6,632,543 B1 * | 10/2003 | Kawamura | ................... 428/690 |
| 6,635,990 B1 | 10/2003 | Pichler | |
| 6,650,047 B2 | 11/2003 | Aoki et al. | |
| 2003/0214227 A1 * | 11/2003 | Tsuchiya | .................... 313/504 |
| 2004/0046498 A1 | 3/2004 | Aoki et al. | |

FOREIGN PATENT DOCUMENTS

| | | |
|---|---|---|
| CN | 1391424 A | 1/2003 |
| JP | 05-343183 A | 12/1993 |
| JP | A-07-053953 | 2/1995 |
| JP | A-09-148071 | 6/1997 |
| JP | A-2000-208260 | 7/2000 |
| JP | A-2001-093671 | 4/2001 |
| JP | A-2001-257073 | 9/2001 |
| JP | 2002-373790 A | 12/2002 |
| JP | A-2002-367787 | 12/2002 |
| KR | 2001-0028643 A | 4/2001 |
| TW | 362335 A | 6/1999 |

OTHER PUBLICATIONS

Huang et al., Surface and Coatings Technology 198 (2005), p. 357-361.*
C. W. Tang, et al., "Organic Electroluminescent Diodes", Applied Physics Letters, vol. 51 (12), Sep. 21, 1987, pp. 913-915.
J. C. Carter, et al., "Operating Stability Of Light-Emitting Polymer Diodes Based On Poly(p-phenylene vinylene)", Applied Physics Letters, vol. 71 (1), Jul. 7, 1997, pp. 34-36.

* cited by examiner

*Primary Examiner*—Dawn Garrett
(74) *Attorney, Agent, or Firm*—Oliff & Berridge, PLC

(57) ABSTRACT

An organic electroluminescent device, comprising an anode; a cathode; and a light-emitting functional portion sandwiched between the anode and the cathode, the light-emitting functional portion including a light-emitting part, an electron injection and transport part, and a hole injection and transport part; the anode being in contact with a titanium oxide particle thin layer.

5 Claims, 6 Drawing Sheets

ORGANIC ELECTROLUMINESCENT DEVICE, MANUFACTURING METHOD THEREOF, AND ELECTRONIC APPARATUS

This application claims the benefit of Japanese patent Application No. 2004-240449, filed Aug. 20, 2004. The entire disclosure of the prior application is hereby incorporated by reference herein in its entirety.

BACKGROUND

The present invention relates to a method for manufacturing an organic electroluminescent device using a liquid-phase process, an organic electroluminescent device manufactured by the method, and an electronic apparatus.

Organic electroluminescent (EL) devices using organic matters have been developed as self light-emitting displays that can replace liquid crystal displays at an accelerated rate in recent years. Examples of methods for manufacturing such organic EL devices that have been proposed include providing low molecules by a vapor-phase process such as evaporation and providing polymers by a liquid-phase process. See *Applied Physics Letters*, Vol. 51 (12), 21 Sep. 1987, p. 913, and *Applied Physics Letters*, Vol. 71 (1), 7 Jul. 1997, p. 34, for example.

Polymer organic EL elements are less reliable than low-molecular organic EL elements. Although this reliability difference is mainly attributed to differences in the rate of developing materials between the two, the above-mentioned process difference is considered to be another factor. Specifically, liquid-phase processes have shortcomings, such as essentially easy mixing of impurities and the low concentration of liquid-phase films, making ion diffusion more likely than in cases with evaporated films. To address these problems, various methods have been employed to reduce impurities and other ions. Here, a method using titanium oxide particles is adopted to block metal ions that are considered to diffuse from an electrode. Japanese Unexamined Patent Application Nos. 4-150369 and 2001-179890 are examples of related art in which titanium oxide is introduced into an organic EL element, although they produce different results.

SUMMARY

An advantage of the invention is to provide an organic electroluminescent element that has a long driving life.

Another advantage of the invention is to provide an electronic apparatus including the above-mentioned organic electroluminescent element.

An organic electroluminescent device according to one aspect of the invention includes an anode, a cathode, and a light-emitting functional portion sandwiched between the anode and the cathode. The light-emitting functional portion includes a light-emitting part, an electron injection and transport part, and a hole injection and transport part.

In this aspect, the anode is in contact with a titanium oxide particle thin layer.

An organic electroluminescent device according to another aspect of the invention also includes an anode, a cathode, and a light-emitting functional portion sandwiched between the anode and the cathode, and the light-emitting functional portion includes a light-emitting part, an electron injection and transport part, and a hole injection and transport part.

In this aspect, the cathode is in contact with a titanium oxide particle thin layer.

An organic electroluminescent device according to yet another aspect of the invention also includes an anode, a cathode, and a light-emitting functional portion sandwiched between the anode and the cathode, and the light-emitting functional portion includes a light-emitting part, an electron injection and transport part, and a hole injection and transport part.

In this aspect, the anode and the cathode may be in contact with a titanium oxide particle thin layer.

In any of the organic electroluminescent devices according to the above-described aspects, the titanium oxide particle thin film that has been deposited may require no post processing that involves heating nor energy line radiation. Examples of energy lines include ultraviolet rays, visible light, infrared rays, and other higher- or lower-energy electromagnetic rays and radioactive rays.

Also in any of the organic electroluminescent devices according to the above-described aspects, a material of the cathode may contain Ca.

Also in any of the organic electroluminescent devices according to the above-described aspects, every organic material of the light-emitting functional portion may be soluble in an aromatic organic solvent.

A method according to still another aspect of the invention for manufacturing an organic electroluminescent device provides every layer except for the electrodes by a liquid-phase process, and thereby achieving a long life. Examples of the liquid-phase process may include spin coating, dipping, and droplet discharge.

An electronic apparatus according to still another aspect of the invention includes any of the organic electroluminescent devices according to the above-described aspects.

BRIEF DESCRIPTION OF THE DRAWINGS

The invention will be described with reference to the accompanying drawings, wherein like numbers refer to like elements, and wherein.

DETAILED DESCRIPTION OF EMBODIMENTS

1. Organic EL Device

Examples in which a method for manufacturing a multi-layered body is applied to an organic EL device will now be shown as embodiments of the present invention. In this example, at least one of an organic light-emitting layer, hole injection layer, and electron injection layer corresponds to the light-emitting functional part.

Figure 1:
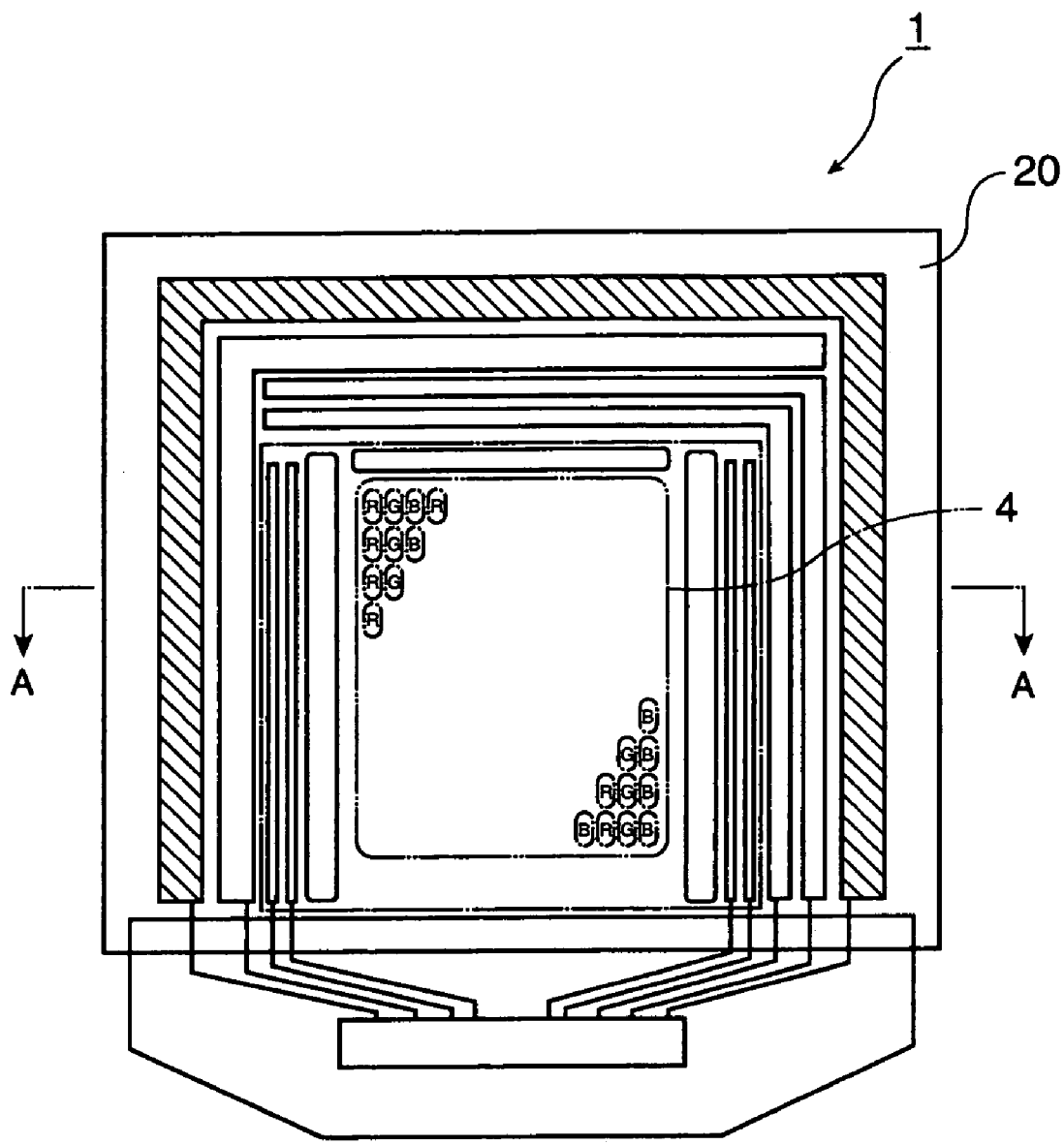
FIG. 1 is a plan view schematically showing the structure of an organic EL device according to one embodiment of the invention.

Referring to FIGS. 1 and 2, an example of an organic EL device according to one embodiment of the invention is described. FIG. 1 is a plan view schematically showing an organic EL device 1. FIG. 2 is a schematic sectional view along line A-A of FIG. 1.

Referring to FIG. 1, the organic EL device 1 includes dots each of which emits red (R), green (G) or blue (B) light in an actual display area 4 to display full color.

Figure 2A:
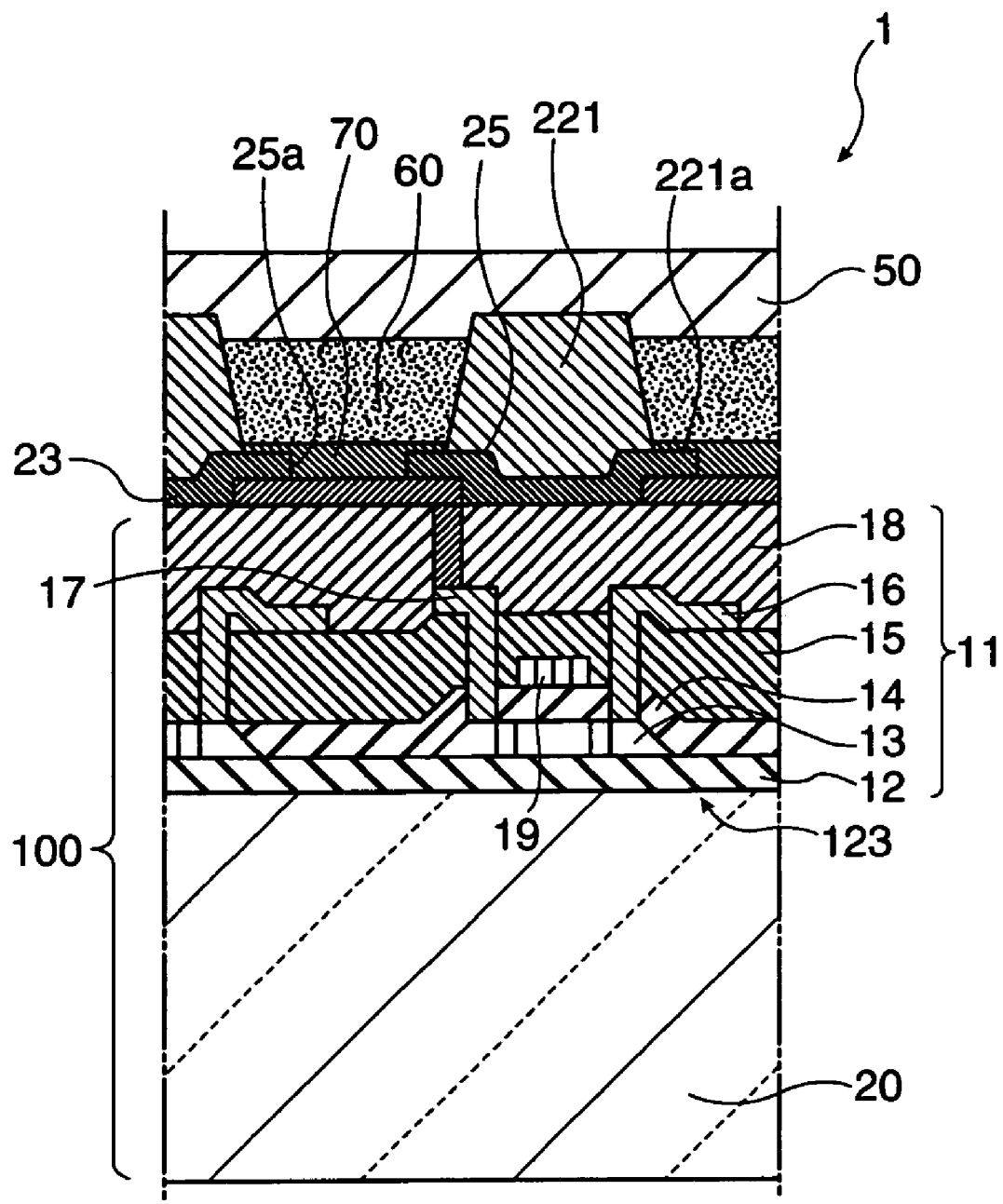
FIG. 2A is a partially enlarged sectional view along line A-A of FIG. 1.

As shown in FIG. 2A, the organic EL device 1 of the present embodiment has a bottom-emission structure. This structure provides light from a substrate 20 side, and therefore the substrate 20 is made of a transparent or translucent material, such as glass, quartz, and resin (plastic and plastic films).

If the organic EL device has a top-emission structure, it provides light from a sealing substrate (not shown) side opposite to the substrate 20. In this case, either a transparent or opaque substrate can be used as the substrate 20. Example materials of opaque substrates include ceramic, such as alumina; sheets of metal, such as stainless steel, provided with surface oxidization or other insulating treatment; thermosetting and thermoplastic resins.

According to the present embodiment, an organic EL element is provided on a base 100. The base 100 includes the substrate 20 and a circuit part 11 provided on the substrate 20.

The circuit part 11 includes a protective layer 12 made of a silicon oxide layer, for example, provided on the substrate 20. Upon the protective layer, the circuit part 11 also includes a driving thin-film transistor (TFT) 123, a first interlayer insulating layer 15, and a second interlayer insulating layer 18. The driving TFT 123 includes a semiconductor layer 13 made of silicon, a gate insulating layer 14 provided on the semiconductor layer 13, a gate electrode 19 provided on the gate insulating layer 14, a source electrode 16 and a drain electrode 17.

Provided on the circuit part 11 is an organic EL element. The organic EL element includes a pixel electrode 23 functioning as an anode, a hole injection layer 70 provided on the pixel electrode 23 for injecting and transporting holes from the pixel electrode 23, an organic light-emitting layer 60 provided on the hole injection layer 70 for emitting light, and a cathode 50 provided on the organic light-emitting layer 60. Although not shown, an electron injection layer for injecting and transporting electrons from the cathode 50 may be provided between the organic light-emitting layer 60 and the cathode 50 as necessary.

Having the above-described structure, the organic EL element 1 emits light by combining holes injected from the hole injection layer 70 and electrons from the cathode 50 in the organic light-emitting layer 60.

The pixel electrode 23 functioning as an anode is made of a transplant conductive material in the present embodiment that provides the bottom-emission structure. Examples of transplant conductive materials may include indium tin oxide (ITO) and indium oxide/zinc oxide amorphous materials (e.g. indium zinc oxide or IZO, registered trademark, produced by Idemitsu Kosan Co., Ltd).

The thickness of the pixel electrode 23 is not particularly limited and ranges from 50 to 200 nm, for example. The surface of the pixel electrode 23 is treated with oxygen plasma to provide a lyophilic surface, clean the electrode surface, and adjust a work function. The oxygen plasma treatment is given under a plasma power of 100 to 800 kW, an oxygen gas flow of 50 to 100 ml per minute, a substrate transport rate of 0.5 to 10.0 mm per second, and a substrate temperature of 70 to 90 degrees Celsius, for example.

The hole injection layer 70 may contain a polymer material having the structure of triphenylamine, for example, as a hole transport material. Compound 1 shown below, ADS254BE produced by ADS, may be adopted as such a polymer material.

The polymer material having the structure of triphenylamine with the functionality of hole transport is expected to serve as a hole transport layer. Furthermore, the material is considered to reduce impurity ions and thus enhance reliability, unlike dispersion systems including polyethylene dioxythiophene with polystyrene sulfonate (PEDOT:PSS), which is currently used as a mainstream. Also, titanium oxide particles contained in a titanium oxide particle layer used in the present embodiment is dispersed in an alcohol solvent, which is preferable for depositing multiple layers. While the hole injection layer and the organic light-emitting layer are separately provided as light-emitting functional layers, it is understood that the two layers can be provided together in the organic light-emitting layer. In this case, the hole injection layer as shown in FIGS. 3 and 4 is not required.

[Compound 1]

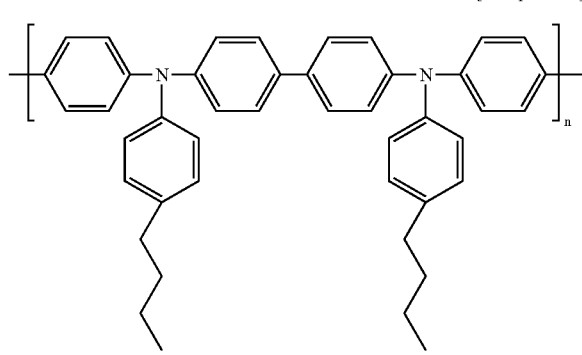

Examples of light-emitting materials of the organic light-emitting layer 60 include, as shown in Compounds 2 to 6 below, polyvinylcarbazole, polyfluorene polymer derivatives, (poly)-paraphenylene-vinylene derivatives, polyphenylene derivatives, polythiophene derivatives, perylene, coumarin and rhodamine dyes, and any of these polymer materials doped with an organic EL material. Examples of dopants may include Rubrene, Perylene, 9,10-diphenylanthracene, tetraphenyl-butadiene, Nile Red, Coumarin 6, and Quinacridone. Another example is iridium complexes, which are phosphorescent materials, including Ir(ppy)3.

[Compound 2]

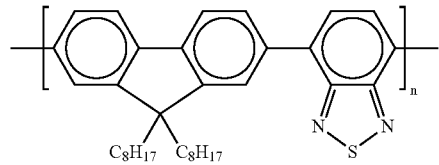

[Compound 3]

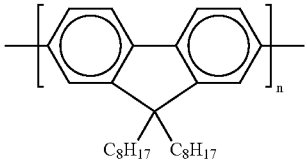

-continued

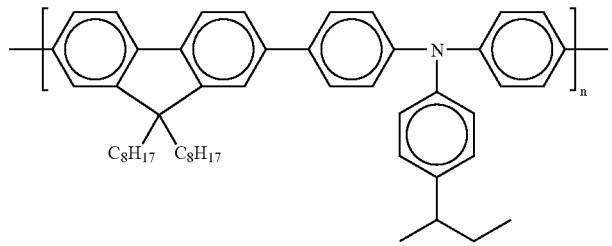

[Compound 4]

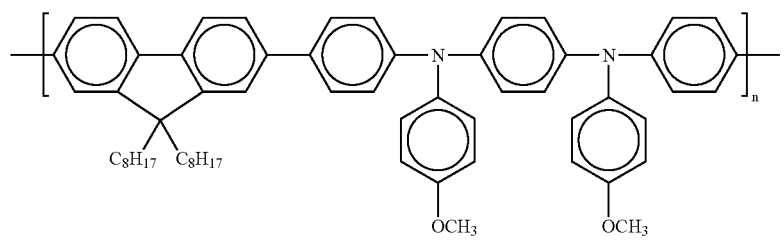

[Compound 5]

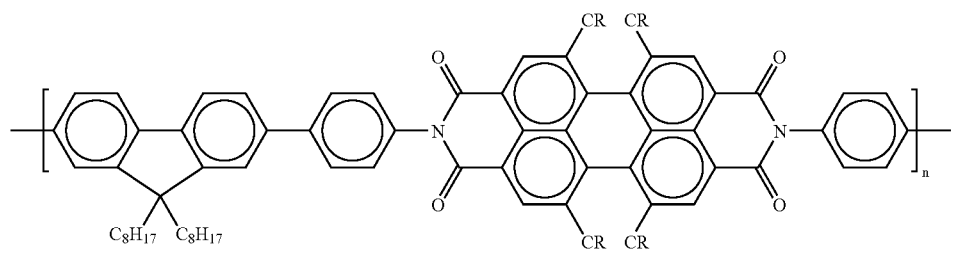

[Compound 6]

Examples of light-emitting materials may also include poly methoxy (2-ethyl) hexyloxy para-phenylene vinylene (MEH-PPV) for emitting red light, poly dioctylfluorene for emitting blue light, and poly (para-phenylene vinylene) (PPV) for emitting green light.

As an electron injection material contained in the electron injection layer (not shown), an alkaline metal halide may be used.

The cathode 50 is provided so as to cover the organic light-emitting layer 60 and an organic bank layer 221.

To form the cathode 50, its lower part facing the organic light-emitting layer 60 desirably has a small work function, and may be made of calcium or magnesium, whereas its upper part on the side of sealing desirably has a higher work function than the lower part, and may be made of aluminum, for example. This aluminum layer also reflects light emitted from the organic light-emitting layer 60. The thickness of the cathode 50 is not particularly limited and ranges from 100 to 1000 nm, for example. More preferably, it ranges from 200 to 500 nm. Since the present emission uses the bottom-emission structure, there is no need for the cathode 50 to transmit light.

The surface of the second interlayer insulating layer 18 to which the pixel electrode 23 is provided is covered by the pixel electrode 23, a lyophilic control layer 25 mainly made of a lyophilic material, such as silicon oxide, and the organic bank layer 221 made of acrylic resin, polyimide, etc. The lyophilic control layer 25 has an opening 25*a*, while the organic bank layer 221 has an opening 221*a*. Inside these openings, the hole injection layer 70 and the organic light-emitting layer 60 are provided in this order from the pixel electrode 23 side. The lyophilic control layer 25 has a higher affinity for liquid at least than the material of the organic bank layer 221, such as acrylic resin and polyimide, according to the present embodiment.

The organic EL device 1 of the present embodiment displays color images. One organic light-emitting layer 60 has a range of light wavelengths corresponding to either of the light's three primary colors. For example, as the organic light-emitting layer 60, an organic red-light-emitting layer, an organic green-light-emitting layer, and an organic blue-light-emitting layer are provided in display areas R, G, and B, respectively. The display areas R, G, B makes up a pixel for displaying color images. The display area R corresponds to one organic light-emitting layer 60 whose range of wavelengths corresponds to red light, and the same can be said for the displays areas G and B. At the boundary of each display area, a black matrix layer (not shown) formed by depositing chromium metal by sputtering, for example, is provided between the organic bank layer 221 and the lyophilic control layer 25.

2. Method for Manufacturing Organic EL Device

Referring to FIGS. 3A, 3B, 3C, 4A and 4B, an example of a method for manufacturing the organic EL device 1 according to the present embodiment will now be described. FIGS. 3 and 4 are sectional views along line A-A of FIG. 1.

Figure 3A:
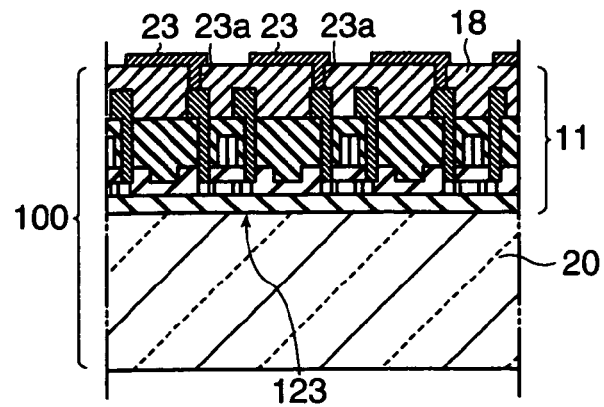
FIGS. 3A, 3B and 3C are sectional views illustrating steps in this order of a method for manufacturing an organic EL device.

(1) Referring to FIG. 3A, the circuit part 11 shown in FIG. 2A is provided on the surface of the substrate 20 by a known method to prepare the base 100. Then a transparent conductive layer to be the pixel electrode 23 is provided so as to cover the entire surface of the uppermost layer, i.e. the second interlayer insulating layer 18, of the base 100. This transparent conductive layer is patterned to form the pixel electrode 23.

Figure 3B:
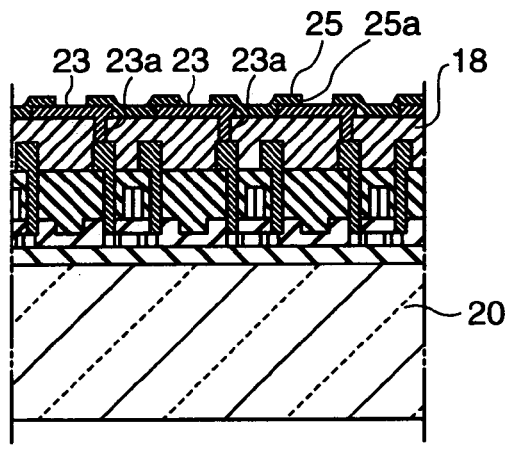

(2) Referring now to FIG. 3B, the lyophilic control layer 25, which is an insulating layer, is provided on the pixel electrode 23 and the second interlayer insulating layer 18. In the lyophilic control layer 25, a black matrix layer (not shown) is provided in a concave between one pixel electrode 23 and another pixel electrode 23. Specifically, the black matrix layer is provided by depositing chromium metal by sputtering, for example, in the concave in the lyophilic control layer 25.

Figure 3C:
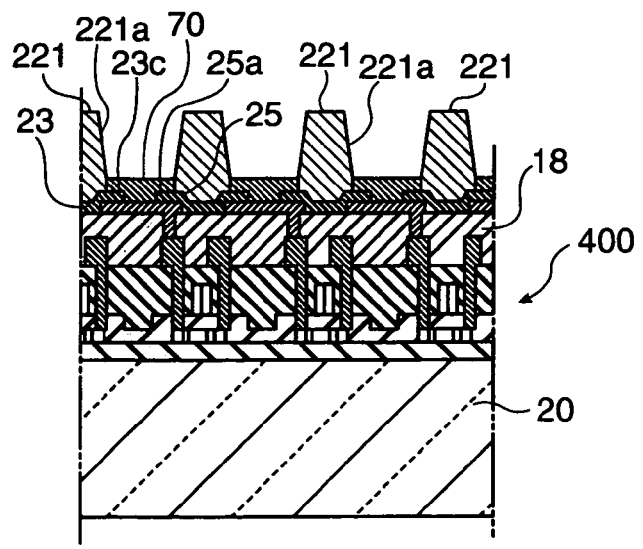

(3) Referring now to FIG. 3C, the organic bank layer 221 is provided at a predetermined position in the lyophilic control layer 25. Specifically, the organic bank layer 221 covers the black matrix layer. The organic bank layer is provided by applying a resist, such as acrylic or polyimide resin, dissolved in a solvent by using spin coating, dip coating, or other application methods. Here, any materials can be used to provide the organic material layer, as long as they do not dissolve in a liquid material solvent that will be described later and is easy to pattern by etching, for example. Then the organic material layer is patterned by photolithography and etching to provide the opening 221a, which completes the organic bank layer 221.

Subsequently, lyophilic and lyophobic areas are formed by plasma treatment. The plasma treatment includes preheating, lyophilic treatment, lyophobic treatment, and cooling steps. The upper surface of the organic bank layer 221, the wall surface of the opening 221a, an electrode surface 23c of the pixel electrode 23, and the upper surface of the lyophilic control layer 25 are made lyophilic in the lyophilic treatment step, whereas the upper surface of the organic bank layer 221 and the wall surface of the opening 221a are made lyophobic in the lyophobic treatment step.

Specifically, the lyophilic treatment step includes: heating a processed body or multilayered body including the pixel electrode 23, the organic bank layer 221, and so on provided on the base 100 up to a predetermined temperature, e.g. about 70 to 80 degrees Celsius; and providing the body with oxygen plasma treatment that uses oxygen gas as a reactive gas in the atmospheric air. Subsequently, the body is subject to $CF_4$ plasma treatment, using tetrafluoromethane as a reactive gas in the atmospheric air, in the lyophobic treatment step. The body, which has been heated for the plasma processing, is then cooled down to room temperature, which makes predetermined portions lyophilic or lyophobic.

The $CF_4$ plasma treatment has some influence on the electrode surface 23c of the pixel electrode 23 and the lyophilic control layer 25 as well. They, however, remain lyophilic, since ITO contained in the pixel electrode 23, and silicon oxide or the like contained in the lyophilic control layer 25 have a low affinity for fluorine, and therefore hydroxyl groups provided there in the lyophilic treatment step are not substituted with fluorine groups.

Figure 2B:
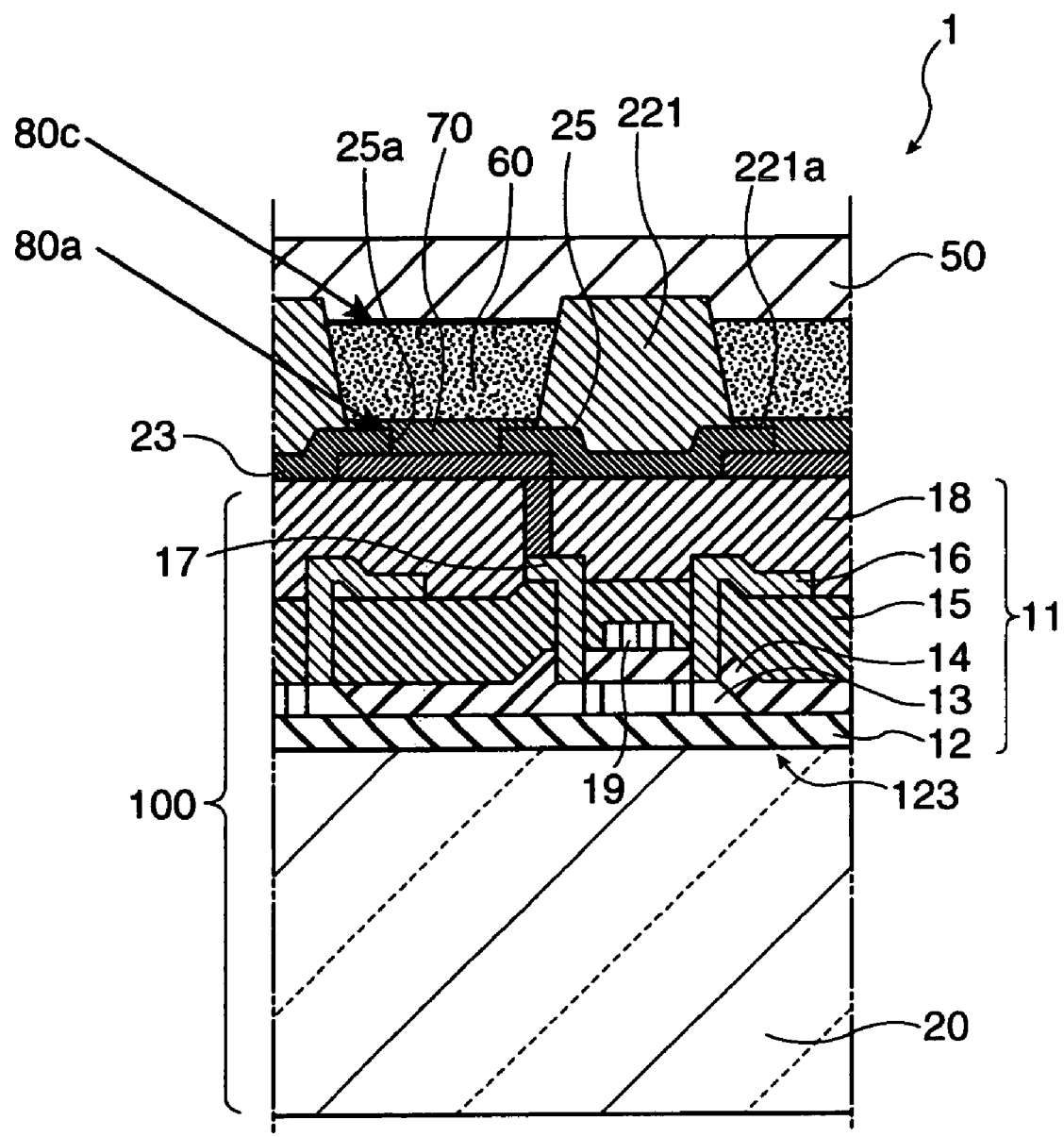
FIG. 2B is a partially enlarged sectional view showing one embodiment of the invention.

(4) To provide a structure including a titanium oxide particle film on the anode side, a titanium oxide particle layer 80a is provided as shown in FIG. 2B. Here, a thin film of a titanium oxide particle dispersion liquid is deposited by spin coating, dipping, or droplet discharge (ink jetting), for example. Note that neither energy line radiation nor heat treatment is employed here. Examples of energy lines include ultraviolet rays, visible light, infrared rays, and other higher- or lower-energy electromagnetic rays and radioactive rays. Drying is natural air drying.

(5) Referring now to FIG. 3C, the hole injection layer 70 is provided. To provide the hole injection layer 70, a thin film is deposited to a thickness of several to several hundred nanometers by a liquid-phase process. The liquid-phase process refers to a method for depositing a thin film by dissolving or dispersing a material to be deposited in a liquid and using this liquid for the process of spin coating, dipping, or droplet discharge (ink jetting), for example. Spin coating and dipping are appropriate for application on an entire surface, whereas droplet discharge provides a thin film pattered in a given area. The same can be said about the liquid-phase process for providing the organic light-emitting layer, electron injection layer, cathode and so on, that will be described later.

In this step, the hole injection layer 70 is provided at a predetermined position by applying a hole injection layer material on the electrode surface 23c by droplet discharge, without patterning by etching or the like.

A process for selectively applying the hole injection layer material by means of droplet discharge (ink jetting) is as follows: filling a discharge droplet head (not shown) with the hole injection layer material; positioning a discharge nozzle of the head to face the electrode surface 23c in the opening 25a included in the lyophilic control layer 25; and discharging droplets each of whose amount is controlled from the nozzle onto the electrode surface 23c with the head and the base moved relative to each other.

Droplets discharged from the nozzle spread on the electrode surface 23c, which has been subject to lyophilic treatment, and fill the opening 25a included in the lyophilic control layer 25. Meanwhile, droplets are repelled on and not attached to the upper surface of the organic bank layer 221, which has been subject to lyophobic (ink repellent) treatment. Accordingly, even if a droplet is discharged not on a predetermined position but on the upper surface of the organic bank layer 221, the surface does not get wet with the droplet. The repelled droplet rolls into the opening 25a included in the lyophilic control layer 25. Consequently, droplets are provided easily and accurately to a predetermined position.

A drying step follows. By evaporating a dispersion medium or solvent contained in the hole injection layer material to a certain extent, the hole injection layer 70 is provided to a thickness of several to several hundred nanometers, for example, on the electrode surface 23c. Here, drying is natural air drying at room temperature, for example.

The hole injection layer 70 may contain a polymer material having the structure of triphenylamine as a hole transport material as mentioned above. As the polymer material, ADS254BE produced by ADS may be used.

As a solvent in which the hole transport material dissolves, xylene is preferably used. Other solvents may include cyclohexylbenzene, dihydrobenzofuran, trimethylbenzene, and tetramethylbenzene.

Figure 4A:
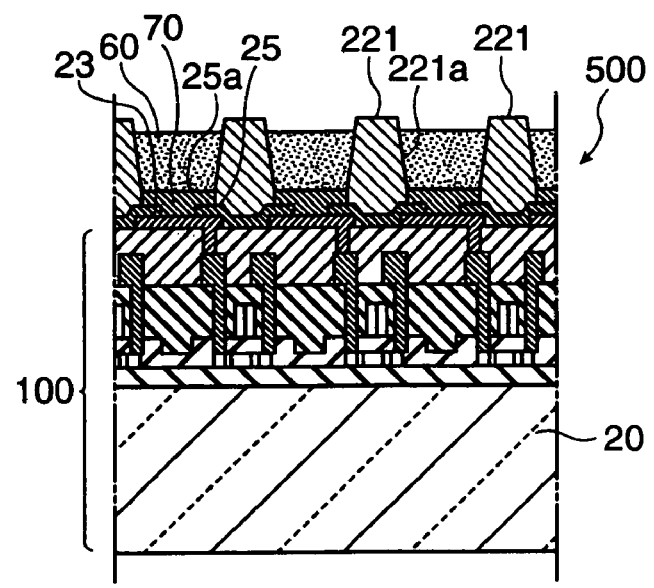
FIGS. 4A and 4B are sectional views illustrating steps following the step shown in FIG. 3C.

(6) Referring now to FIG. 4A, the organic light-emitting layer 60 is provided on the hole injection layer 70. To provide the organic light-emitting layer 60, three types of liquid materials are provided. Each type of the liquid materials emits either red, green, or blue light.

These liquid materials are discharged at predetermined positions on the hole injection layer 70 by droplet discharge, for example. A drying step follows to complete the organic light-emitting layer 60 in the opening 221a included in the organic bank layer 221. If droplet discharge has been employed for applying the materials, this drying step is preferably performed by dry evaporation involving heating at a temperature of 100 degrees Celsius or lower on a hot plate and further pressure reduction. If spin coating or dipping has been employed for applying the materials, the drying step is performed by spraying nitrogen on the substrate or rotating the substrate to produce an air current on the substrate surface. Alternatively, the drying may be natural air drying.

Examples of light-emitting materials of the organic light-emitting layer 60 include, as shown in Compounds 2 to 6, polyvinylcarbazole, polyfluorene polymer derivatives, (poly)-paraphenylene-vinylene derivatives, polyphenylene derivatives, polythiophene derivatives, perylene, coumarin and rhodamine dyes, and any of these high molecules doped with an organic EL material as mentioned above. Examples of such dopants may include Rubrene, Perylene, 9,10-diphenylanthracene, tetraphenyl-butadiene, Nile Red, Coumarin 6, and Quinacridone. Another example is iridium complexes, which are phosphorescent materials, including Ir(ppy)3.

Examples of light-emitting materials may also include poly methoxy (2-ethyl) hexyloxy para-phenylene vinylene (MEH-PPV) for emitting red light, poly dioctylfluorene for emitting blue light, and para-phenylene vinylene (PPV) for emitting green light.

As a solvent or dispersion medium in which organic light-emitting materials dissolve, the same type as the solvent that dissolves the hole injection layer material can be used. For example, xylene, cyclohexylbenzene, dihydrobenzofuran, trimethylbenzene, or tetramethylbenzene can be used here.

Accordingly, a multilayered body including at least the anode (pixel electrode) 23, the hole injection layer 70, and the organic light-emitting layer 60 on the base 100 has been provided.

(7) Subsequently, an electron injection layer (not shown) is provided as necessary. To provide the electron injection layer, an electron injection layer material is applied on the organic light-emitting layer 60 by droplet discharge.

(8) To provide a structure including another titanium oxide particle film on the cathode side, a titanium oxide particle layer 80c is provided as shown in FIG. 2B. A thin film of a titanium oxide particle dispersion liquid is deposited by spin coating, dipping, or droplet discharge (ink jetting), for example. Note that neither energy line radiation nor heat treatment is employed here. Energy line radiation and heat treatment are inappropriate for providing the titanium oxide particle layer 80c on the cathode side after the light-emitting functional layers have been deposited in particular, since these processes can degrade each organic layer.

Figure 4B:
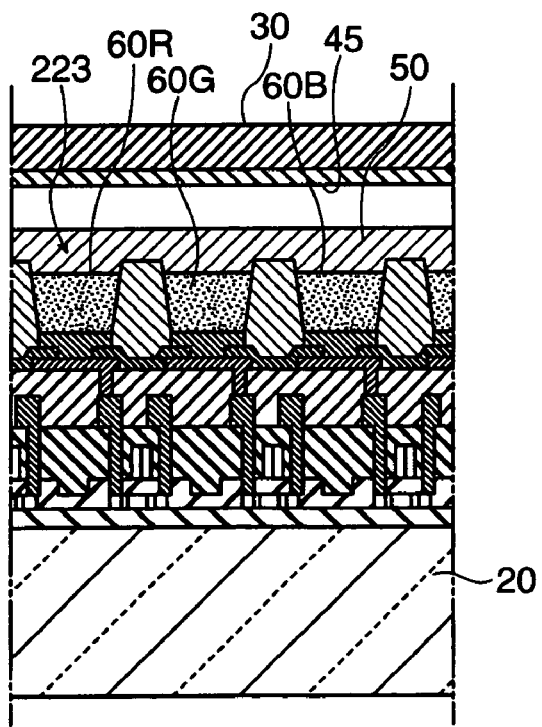

(9) Referring now to FIG. 4B, the cathode 50 is provided on the organic light-emitting layer 60. To provide the cathode 50, a cathode material, such as aluminum, is deposited by evaporation or sputtering.

Subsequently, a sealing substrate 30 is provided by a sealing step. In this sealing step, a film 45 for drying is adhered inside the sealing substrate 30, and then the sealing substrate 30 and the substrate 20 are sealed with a sealing resin (not shown) in order to prevent water and oxygen from coming into the inside of the organic EL element that has been made. Examples of materials of the sealing resin may include thermosetting and ultraviolet-curing resins. Note that this sealing step is preferably performed in an inert gas atmosphere of nitrogen, argon, helium, etc. Although not shown, a thermosetting or ultraviolet-curing resin instead of the film 45 for drying can be directly placed on the cathode.

The organic EL device 1 provided as described desirably emits light from the pixel electrode 23 side in particular, by applying a voltage of 10 V or less, for example, between the two electrodes.

It should be understood that a titanium oxide particle film may be deposited by both or either of the steps (4) and (8).

While the cathode 50 is provided by a vapor-phase process, such as evaporation and sputtering, in the above-described embodiment, it may be replaced by a liquid-phase process using a solution or dispersion liquid containing a conductive material.

For a specific example, the cathode 50 may be made up of a main cathode that contacts with the organic light-emitting layer 60 and an auxiliary cathode deposited upon this main cathode. Both the main and auxiliary cathodes may be made of conductive materials by a liquid-phase process, such as liquid discharge.

For example, a conductive polymer material made of a polymer compound containing ethylene dioxythiophene may be used to form the main cathode. Specifically, 3,4- polyethylene dioxythiophene/polystyrene sulfonic acid may be used as the conductive polymer material. Instead of or together with the conductive polymer material, metal particles can be used to form the main cathode. The main cathode made of a mixture of the conductive polymer material and metal particles enables burning at a comparatively low temperature while securing its conductivity. Examples of such metal particles may include gold, silver, and aluminum particles. Instead of the metal particles of gold, silver, or the like, carbon paste can also be used here.

The auxiliary cathode is deposited on the main cathode to enhance the conductivity of the cathode 50 as a whole. The auxiliary cathode covers the main cathode to protect it from oxygen and moisture, for example, and is made of conductive metal particles. Any conductive particles of metal or an alloy, for example, can be used here as long as they are chemically stable. Specifically, aluminum, gold, and silver particles can be used.

Providing the cathode 50 by liquid-phase processes requires no vacuum conditions, which are required by vapor-phase processes. Accordingly, the cathode 50 can be formed soon after the organic light-emitting layer 60 is provided. This process facilitates manufacturing and enhances productivity. If the pixel electrode (anode) is also provided by a liquid-phase process, all the manufacturing steps of the organic EL element including the anode, functional (hole injection and light-emitting) layers, and cathode are carried out by liquid-phase processes, and thereby further facilitating manufacturing and enhancing productivity.

While the bottom-emission structure is used above, the present embodiment is not limited to this and applicable to a top-emission structure and a structure capable of emitting light from both the top and bottom.

According to the manufacturing method of the present embodiment, all the light-emitting functional parts, such as the hole injection, organic light-emitting, and electron injection layers, are provided by liquid-phase processes. They provide each of the layers more easily than vapor-phase processes.

3. Example

A case in which a titanium oxide particle layer is provided on the anode side and another case on the cathode side will now be described. As a comparison sample, yet another case in which no titanium oxide particle layer is provided will also be described.

Providing a titanium oxide particle layer will now be described.

In this example, ST-K211 produced by Ishihara Sangyo Kaisha, Ltd. was used as titanium oxide particles. A dispersion of the particles went through a 0.2-µm filter to drip. Then spin coating was performed at 1000 rpm for 120 seconds. Here, the film thickness was measured to be 100 angstrom or less with a contact step measure. In one case for providing a titanium oxide particle layer on the anode side, depositing a hole injection material as mentioned below followed. In the other case for providing a titanium oxide particle layer on the cathode side, light-emitting function layers were deposited as described below. Titanium oxide particles were then deposited, and evaporation of the cathode followed soon after.

This example used hole injection and organic light-emitting layers as the light-emitting function parts.

Samples used in this example were prepared as follows. As a hole injection material, ADS254BE produced by ADS, a polymer material having the structure of triphenylamine, was used. This polymer ADS254BE was dissolved in chloroform to prepare an application solution. This application solution was applied on a glass substrate by spin coating, and a resultant film was naturally dried. The hole injection layer was thus provided on the substrate to a thickness of 30 nm.

Provided on the hole injection layer was the organic light-emitting layer. The organic light-emitting layer was made of a polyfluorene polymer derivative that was dissolved in xylene to prepare another application solution. This application solution was applied on the hole injection layer by spin coating, and a resultant film was naturally dried.

This way a first sample having the titanium oxide particle layer on the anode interface and a second sample on the cathode side were prepared. The life of each sample was measured while driven at a fixed luminance.

Figure 6:
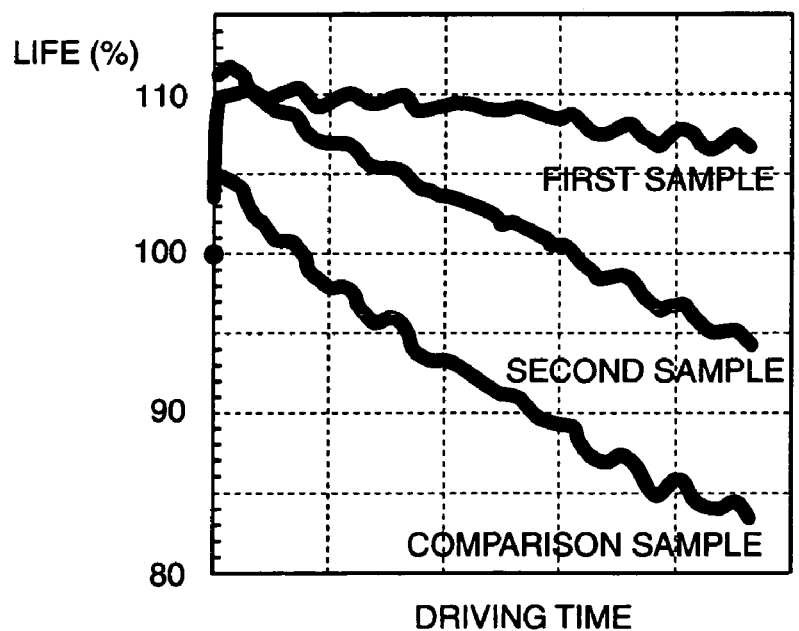
FIG. 6 is a life comparison chart.

As an EL initial property, the first sample having the titanium oxide particle layer on the anode side had almost the same luminance and current efficiency as those of the comparison sample having no titanium oxide particle layer. The second sample having the titanium oxide particle layer on the cathode side, however, had a little lower luminance and a current efficiency that was about 80% of that of the comparison sample. Aging results of these samples at a fixed luminance are shown in FIG. 6. This table shows the results until the luminance of the comparison sample reduced by around 20%. It clearly shows that both the first and second samples having the titanium oxide particle layers provide a longer life than the comparison sample having no titanium oxide particle layer. At a point where the life of the comparison sample was reduced to 83%, that of the second sample remained at 94%, and that of the first sample even grew to 107%. These results prove that the titanium oxide particle layers make a difference.

Although not shown, the luminance was reduced to 99% with the first sample heated at 100 degrees Celsius for 10 minutes. This result shows that heating can bring aging. This tendency was more significant for the second sample, whose luminance was halved for the same time period.

Irradiated with ultraviolet rays, the first sample almost retained its initial properties, whereas the second sample lost its initial properties as a matter of course, and some of its pixels did not even emit light. This is considered to be attributed to the aging of light-emitting parts. This result shows that ultraviolet ray irradiation does not work desirably for the life property.

The life increase observed in this example is considered to be attributed to the block effect of metal ions, for example, generated by each electrode. This is because the life property enhanced without improvement of initial properties.

4. Electronic Apparatus

Figure 5:
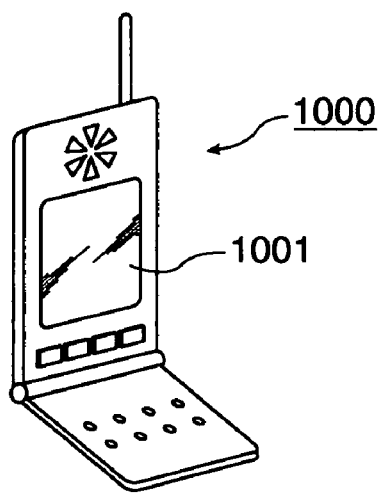
FIG. 5 is a perspective view showing an electronic apparatus according to another embodiment of the invention.

An example of electronic apparatuses according to another embodiment of the invention will now be described. An electronic apparatus of the present embodiment of the invention is equipped with the organic EL device 1 as a display. FIG. 5 show a mobile phone as a specific example of such an apparatus.

FIG. 5 shows a mobile phone 1000 and a display 1001 using the organic EL device 1 according to the above-mentioned embodiment. Since the mobile phone shown in FIG. 5 includes the display 1001 using the organic EL device, it has an excellent display property.

Examples of electronic apparatuses of the present embodiment of the invention are not limited to this mobile phone. The invention is also applicable to mobile information processing devices including word processors and personal computers, wristwatch electronic apparatuses, and flat panel displays of TV sets, for example.

What is claimed is:

1. An organic electroluminescent device, comprising:
an anode;
a cathode containing at least calcium or magnesium;
a light-emitting functional portion sandwiched between the anode and the cathode;
a titanium oxide particle thin layer;
a lyophilic control layer; and
an organic bank layer disposed on a part of the lyophilic control layer,
the anode being in contact with a titanium oxide particle thin layer,
the titanium oxide particle thin layer being formed in the organic electroluminescent device by a process free from heating and energy line radiation of the organic electroluminescent device, and
the lyophilic control layer being discontinuous such that in a first location, the lyophilic control layer is disposed between the anode and the titanium oxide particle thin layer, and in a second location, the lyophilic control layer is not disposed between the anode and the titanium oxide particle thin layer, the anode being in contact with the titanium oxide particle thin layer at the second location.

2. An organic electroluminescent device, comprising:
an anode;
a cathode containing at least calcium or magnesium;
a light-emitting functional portion sandwiched between the anode and the cathode;
a titanium oxide particle thin layer;
a lyophilic control layer; and
an organic bank layer disposed on a part of the lyophilic control layer,
the cathode being in contact with a titanium oxide particle thin layer,
the titanium oxide particle thin layer being formed in the organic electroluminescent device by a process free from heating and energy line radiation of the organic electroluminescent device, and
the lyophilic control layer being discontinuous such that in a first location, the lyophilic control layer is disposed between the anode and the titanium oxide particle thin layer, and in a second location, the lyophilic control layer is not disposed between the anode and the titanium oxide particle thin layer, the anode being in contact with the titanium oxide particle thin layer at the second location.

3. An organic electroluminescent device according to claim 1,
the cathode being in contact with an other titanium oxide particle thin layer.

4. An electronic apparatus, comprising:
the organic electroluminescent device according to claim 1.

5. A method for manufacturing an organic electroluminescent device, comprising:
forming an anode on a substrate;
forming a lyophilic control layer on the substrate;
forming an organic bank layer on a part of the lyophilic control layer, an upper surface of the organic bank layer being subject to lyophobic treatment;

forming a first titanium oxide particle thin layer on the anode;
forming a light-emitting functional portion on the first titanium oxide particle thin layer;
forming a second titanium oxide particle thin layer on the light-emitting functional portion; and
forming a cathode on the second titanium oxide particle thin layer, wherein
the light-emitting functional portion, the first titanium oxide particle thin layer and the second titanium oxide particle thin layer are formed by liquid-phase processes,
the first titanium oxide particle thin layer and the second titanium oxide particle thin layer are formed in the organic electroluminescent device without heating and energy line radiation of the organic electroluminescent device, a part of the cathode facing the light-emitting functional portion has a lower work function than a part of the cathode not facing the light-emitting functional portion, and the lyophilic control layer being discontinuous such that in a first location, the lyophilic control layer is disposed between the anode and the titanium oxide particle thin layer, and in a second location, the lyophilic control layer is not disposed between the anode and the titanium oxide particle thin layer, the anode being in contact with the titanium oxide particle thin layer at the second location.

* * * * *